United States Patent [19]
Manning

[11] Patent Number: 6,141,239
[45] Date of Patent: *Oct. 31, 2000

[54] STATIC MEMORY CELL

[75] Inventor: Monte Manning, Kuna, Id.

[73] Assignee: Micron Technology, Inc., Boise, Id.

[ * ] Notice: This patent is subject to a terminal disclaimer.

[21] Appl. No.: 09/366,150

[22] Filed: Aug. 3, 1999

Related U.S. Application Data

[63] Continuation of application No. 09/129,143, Aug. 5, 1998, Pat. No. 5,940,317, which is a continuation of application No. 08/690,124, Jul. 31, 1996, Pat. No. 5,818,750.

[51] Int. Cl.⁷ .................................................. G11C 11/00
[52] U.S. Cl. .......................................... 365/154; 257/296
[58] Field of Search ............................. 365/154; 257/296

[56] References Cited

U.S. PATENT DOCUMENTS

| | | | |
|---|---|---|---|
| 4,868,138 | 9/1989 | Chan et al. | 437/44 |
| 5,126,279 | 6/1992 | Roberts | 437/52 |
| 5,173,754 | 12/1992 | Manning | 257/69 |
| 5,175,127 | 12/1992 | Manning | 437/195 |
| 5,196,910 | 3/1993 | Moriuchi et al. | 357/23.6 |
| 5,212,399 | 5/1993 | Manning | 257/369 |
| 5,215,932 | 6/1993 | Manning | 437/41 |
| 5,240,874 | 8/1993 | Roberts | 437/69 |
| 5,241,206 | 8/1993 | Lee et al. | 257/380 |
| 5,273,924 | 12/1993 | Chan et al. | 437/46 |
| 5,275,963 | 1/1994 | Cederbaum et al. | 437/48 |
| 5,320,975 | 6/1994 | Cederbaum et al. | 437/44 |
| 5,327,377 | 7/1994 | Kawashima | 365/156 |
| 5,327,394 | 7/1994 | Green et al. | 365/233.5 |
| 5,390,143 | 2/1995 | Manning | 365/145 |
| 5,411,909 | 5/1995 | Manning et al. | 437/52 |
| 5,422,499 | 6/1995 | Manning | 257/67 |
| 5,545,584 | 8/1996 | Wuu et al. | 437/52 |
| 5,568,435 | 10/1996 | Marr | 365/201 |
| 5,583,821 | 12/1996 | Rose et al. | 365/226 |
| 5,600,588 | 2/1997 | Kawashima | 365/154 |
| 5,610,856 | 3/1997 | Yoshizumi et al. | 365/154 |
| 5,675,160 | 10/1997 | Oikawa | 257/296 |
| 5,781,482 | 7/1998 | Sakata | 365/189.11 |
| 5,818,090 | 10/1998 | Kimura | 257/369 |
| 5,818,750 | 10/1998 | Manning | 365/154 |

FOREIGN PATENT DOCUMENTS

| | | |
|---|---|---|
| 087979 | 9/1993 | European Pat. Off. . |
| 06053442 | 2/1994 | Japan . |
| 07130876 | 5/1995 | Japan . |
| 07130877 | 5/1995 | Japan . |

OTHER PUBLICATIONS

"ISSCC Digital ICs", *Electronic Design*, 37, No. 4, Hasbrouck Heights, MJ, US, pp. 49–53, (Feb. 23, 1989).

*Primary Examiner*—David Nelms
*Assistant Examiner*—M. Tran
*Attorney, Agent, or Firm*—Schwegman, Lundberg, Woessner & Kluth, P.A.

[57] ABSTRACT

A static memory cell is described which has cross coupled pulldown transistors and dual access transistors. The memory cell is fabricated such that balanced current paths are formed through the two pulldown transistors. A single word line is used to activate the access transistors which couple the memory cell to complementary bit lines. The memory cells, as viewed in a plan view, have the single word line and gates of the pulldown transistors fabricated in parallel.

15 Claims, 6 Drawing Sheets

STATIC MEMORY CELL

This application is a Continuation of U.S. Ser. No. 09/129,143 filed Aug. 5, 1998, now U.S. Pat. No. 5,940,317, which is a continuation of Ser. No. 08/690,124 filed Jul. 31, 1996 now U.S. Pat. No. 5,818,750, issued Oct. 6, 1998.

TECHNICAL FIELD OF THE INVENTION

The present invention relates generally to memory devices and in particular the present invention relates to a memory device having static memory cells fabricated with a single bit line.

BACKGROUND OF THE INVENTION

Static random access memories (SRAM's) comprise static memory cells which are designed to operate as a data latch. The memory cells typically use access transistors to couple the memory cell to a pair of complementary bit lines. The memory cell access transistors are selectively activated using a word line signal. Sense amplifier circuitry is used to detect voltage differentials between the bit lines. A pair of cross-coupled pulldown transistors are typically connected to the access transistors and are used to latch data.

Different static memory cell integrated circuit layouts have been used, however, these cells either have asymmetrical current paths through the pulldown transistors or require two word lines. The asymmetrical memory cells tend to be both unstable and susceptible to process variables such as two dimensional encroachment. Memory cells which use two word lines are more electrically symmetrical, but require additional die area for the second word line.

For the reasons stated above, and for other reasons stated below which will become apparent to those skilled in the art upon reading and understanding the present specification, there is a need in the art for a memory cell which has the stability of the dual word line memory cell while requiring die area similar to the single word line memory cell.

SUMMARY OF THE INVENTION

The above mentioned problems with static memory cells and other problems are addressed by the present invention and which will be understood by reading and studying the following specification. A static memory cell is described which has a single word line and un-interrupted active area.

In particular, the present invention describes a static memory cell comprising access transistors coupled to bit lines, each of the access transistors having a gate connected to a single word line, and pulldown transistors connected to the access transistors. Each of the pulldown transistors has a gate fabricated essentially parallel to the single word line in a plan view.

In an alternate embodiment, an SRAM cell is described which comprises a first access transistor having a drain connected to a first bit line and a gate connected to a single word line. The cell includes a first pulldown transistor having a drain connected to a source of the first access transistor, a source coupled to a bias voltage, and a gate fabricated parallel to the single word line in a plan view. A second access transistor is provided which has a drain connected to a second bit line and a gate connected to the single word line. Finally, a second pulldown transistor is provided which has a drain connected to a source of the second access transistor, a source coupled to the bias voltage, and a gate fabricated parallel to the single word line in a plan view.

In another embodiment, a static random access memory device is described which comprises an array of static memory cells. The static memory cells comprise a first access transistor connected to a first pulldown transistor thereby defining a first current path, and a second access transistor connected to a second pulldown transistor thereby defining a second current path substantially equal to the first current path. The memory has a plurality of data communication paths for bi-directional data communication with an external processor, and an address decoder for decoding an address signal provided by the external processor and accessing the array.

In yet another embodiment, an SRAM cell is provided which comprises a first access transistor fabricated in a first silicon active area having a drain connected to a first bit line, and a gate connected to a single word line. A first pulldown transistor is fabricated in the first silicon active area having a drain connected to a source of the first access transistor, and a source coupled to a bias voltage thereby defining a first electrical current path through the first silicon active area. A second access transistor fabricated in a second silicon active area having a drain connected to a second bit line, and a gate connected to the single word line. A second pulldown transistor fabricated in the second silicon active area having a drain connected to a source of the second access transistor, and a source coupled to the bias voltage thereby defining a second electrical path through the second silicon active area which is substantially symmetrical with first electrical current path.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
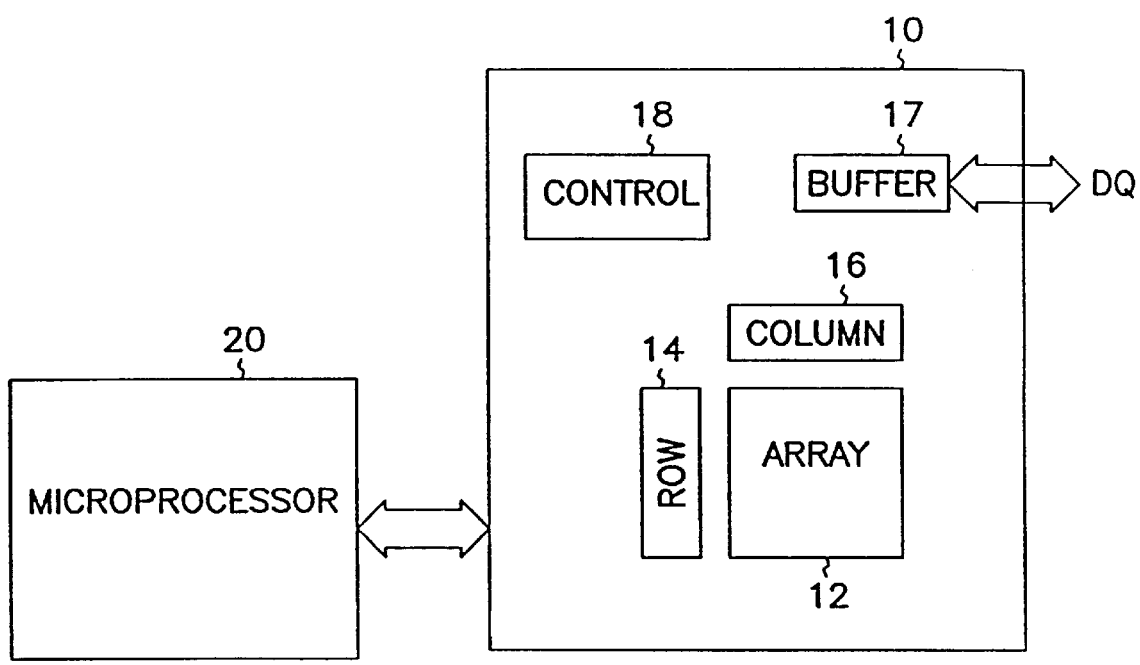
FIG. 1 is a block diagram of a memory device of the present invention.

Referring to FIG. 1, the basic static memory 10 is well known in the art to include a memory array 12 constructed of rows and columns of static memory cells having inputs and outputs corresponding to rows and columns. Row decode circuit 14 and column 16 decode circuitry is provided to access the memory array in response to an address provided by an external controller 20, such as a standard microprocessor. Control circuitry 18 is provided to control either synchronous or asynchronous data communication between the memory 10 and external devices. Buffers are coupled to the data communication lines (DQ's) for bi-directional data communication with the memory array 12. It will be appreciated that the description of SRAM 10 has been simplified to focus on specific features of the present invention and is not intended to be a detailed description of all the circuitry of a basic SRAM.

Basic SRAM Cell

Figure 2:
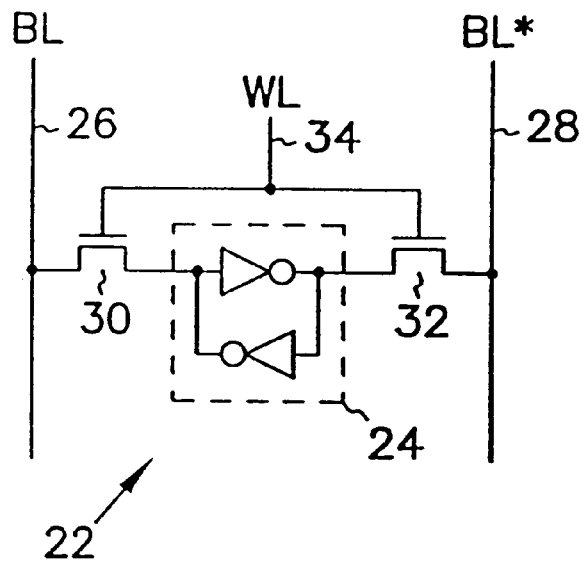
FIG. 2 is a schematic diagram of a basic static memory cell.
Figure 3:
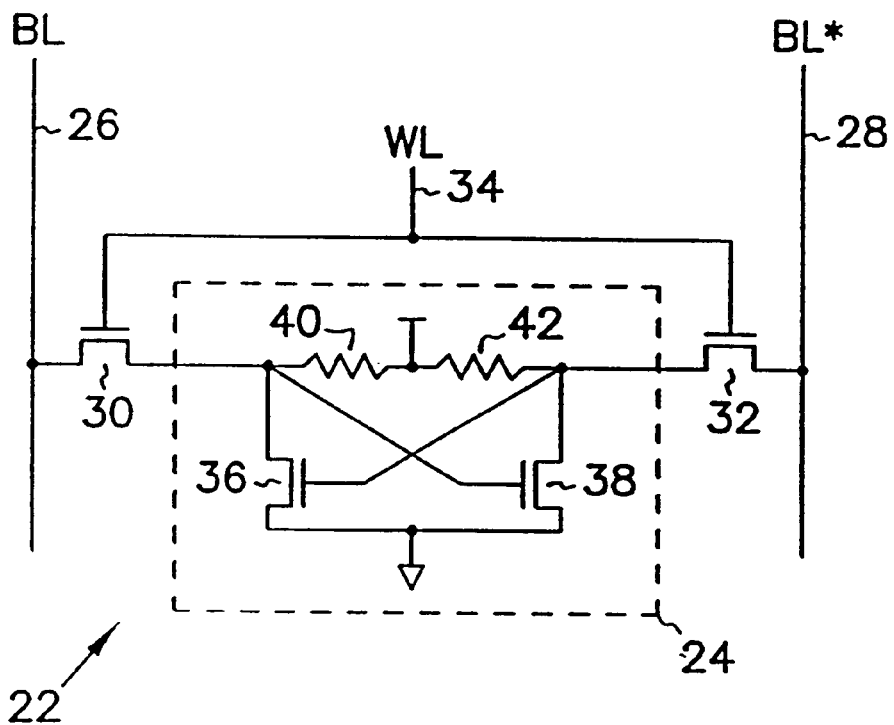
FIG. 3 is a more detailed schematic diagram of the static memory cell of FIG. 2.

FIG. 2 illustrates a functional diagram of a static memory cell 22. The memory cells operate as a data latch 24 which can be connected to complementary bit lines 26 and 28 by activating access transistors 30 and 32 using a common word line 34. The static memory cell can be fabricated as shown in FIG. 3 having two cross coupled pulldown transistors 36 and 38. To write data to the memory cell, the access transistors 30 and 32 are activated by providing a signal on the word line 34. Voltages provided on the complimentary bit lines 26 and 28 are sufficient to place the latch in a state corresponding to the bit lines. If the memory cell was storing data of an opposite logic state, the bit line voltages toggle the latch 24 by overpowering bias currents through pull-up resistors 40 and 42. That is, if bit line 26 is at a high potential and bit line 28 is at a low potential when the word line transitions to a high potential, transistor 38 is activated and transistor 36 is turned off. To read a memory cell, the access transistors are activated to couple the pulldown transistors 36 and 38 to bit lines 26 and 28. Sense amplifier circuitry (not shown) is provided to detect and amplify a differential voltage provided on the bit lines. It will be understood that the SRAM 10 is fabricated as an integrated circuit and that a minimum memory cell layout is desired to maximize memory density.

SRAM Cell Designs

Figure 4:
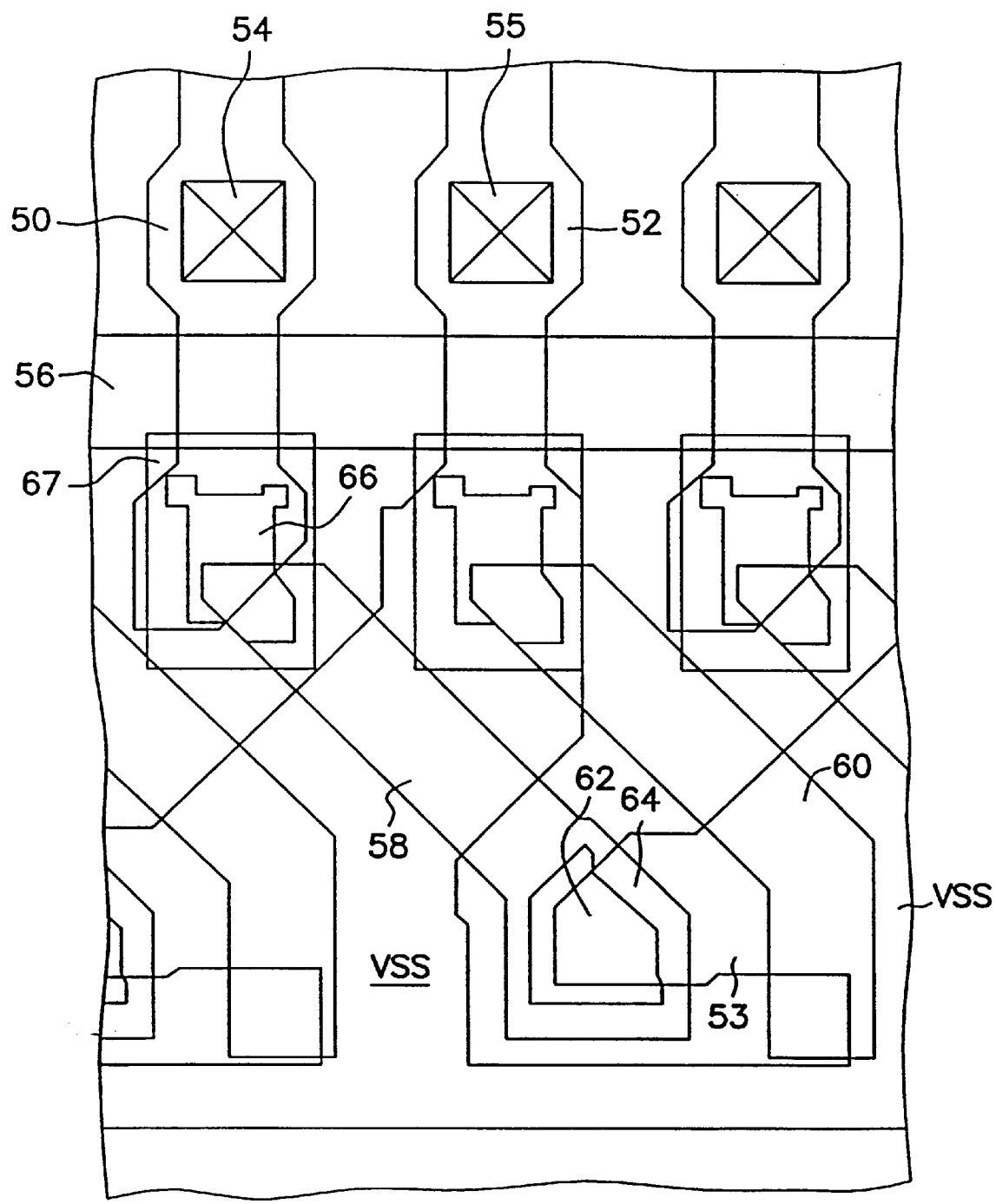
FIG. 4 is a plan view of a prior art static memory cell.

As SRAM elements continue to shrink, various memory cell designs have been pursued. One common design has been a single word line memory cell with pulldown transistors having a polysilicon gate fabricated either perpendicular or at a diagonal with respect to the word line. An example of this SRAM memory cell design is shown in the plan view of FIG. 4. The memory cell has two access transistors fabricated using active areas 50 and 52. Each access transistor has a drain region connected to a bit line (not shown) through bit line contacts 54 and 55. The gate of each access transistor is connected to a word line 56 fabricated with a first layer of polysilicon (poly 1). One pulldown transistor is fabricated using active area 53. A second pulldown transistor is fabricated using active area 52. The gates 58 and 60 of both pulldown transistors are fabricated in poly 1. It is apparent from FIG. 4 that in a plan view the gates are fabricated at a diagonal with the word line.

In this SRAM memory cell, the second pulldown transistor gates current from VSS (ground) to the source of the second access transistor. Thus, all of the current from VSS to the access transistor, and to bit line contact 55, is carried through active area. Because the active area of the first pulldown transistor is separated from active area 50, its drain is connected to a buried contact 62. The buried contact is connected to area 64 of the poly 1 layer defining the gate 58 of the second pulldown transistor. The polysilicon gate 58 connects the two separate active areas 50 and 53 which carries the first pulldown transistor's current to through an exhumed contact 66 where it can then be passed through the access transistor to the bit line contact 54. The exhumed contact 66 connects poly 1 layer 58 to active area 50 through a second layer of poly 67. It will be appreciated that pullup devices, such as resistors 40 and 42 or thin film transistors (TFT), are included in the SRAM cell (not shown) and are fabricated over the pulldown devices.

It will be appreciated that current passes through the first pulldown transistor starting with in active area 53, but then must go through a buried contact 62, gate poly 58, and an exhumed contact 66 before getting back to active area 50. Given process variations from lot to lot and wafer to wafer, it is very hard to match the parasitic resistances associated with the current paths of both pulldown transistors. One lot might have high exhumed contact resistance which would throw the symmetry of the memory cell off and degrade cell stability thereby causing a lower yield. Another disadvantage of this memory cell is that at the point where buried contact 62 is made to active area 53, the active area pattern is very susceptible to two dimensional (2D) field oxide encroachment. Thus, as the memory cell is scaled to smaller dimensions, this active area tip gets much smaller due to field oxide encroachment from two sides leaving a much thicker oxide through which the buried contact must penetrate.

Figure 5:
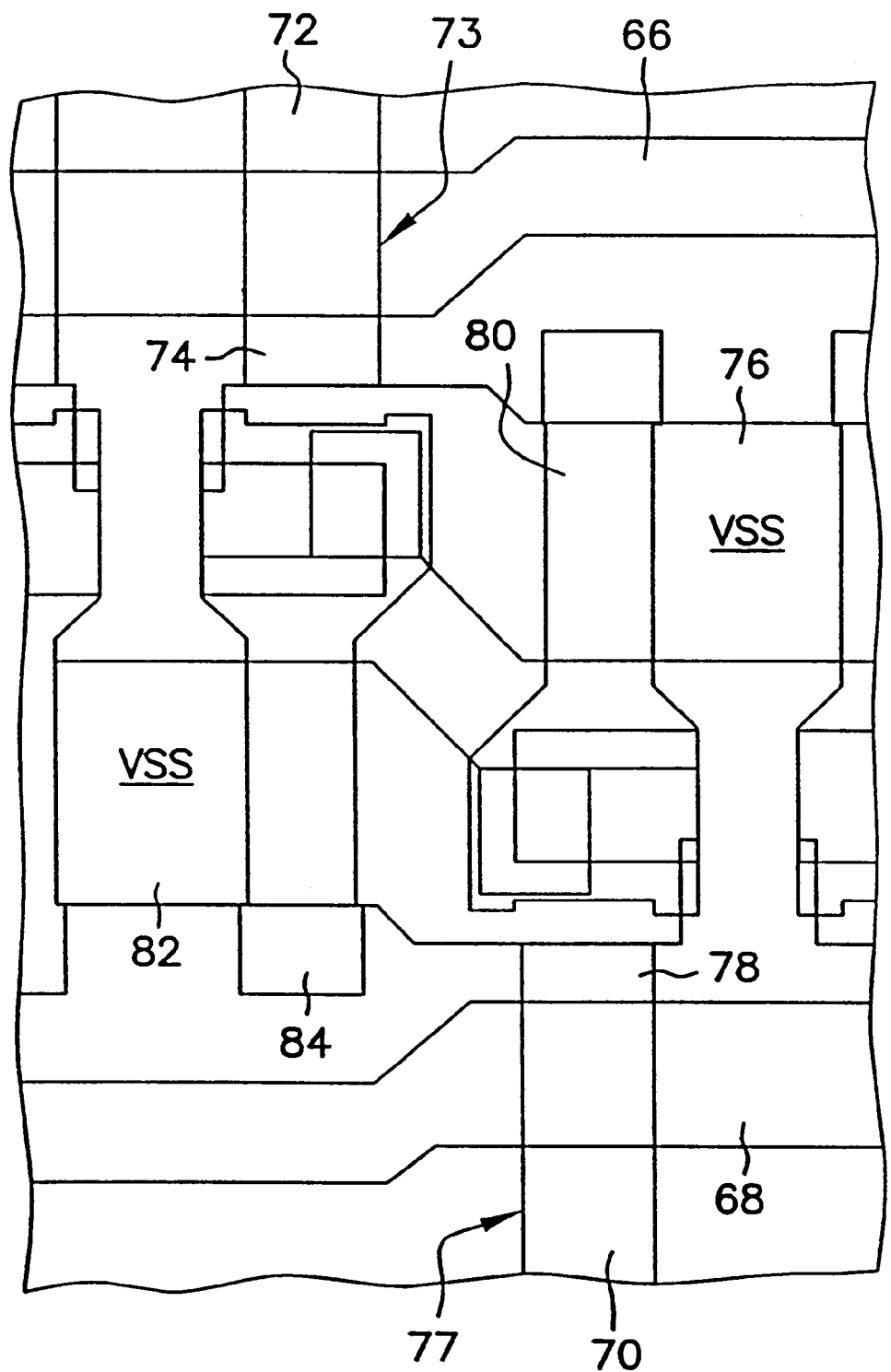
FIG. 5 is a plan view of a prior art static memory cell.

As an alternative to the above described SRAM memory cell, a dual word line SRAM memory cell was introduced. Referring to the plan view of FIG. 5, the dual (or split) word line memory cell is fabricated symmetrically such that two pulldown transistors are substantially identical. In this memory, the word line is split into two separate word lines 66 and 68 which carry the same signal. Uninterrupted active area can be used to connect the two bit line contact areas 70 and 72 to VSS.

A first access transistor is defined by active area region 73 and active area region 74. The first word line 66 is fabricated in a poly 1 layer. A first pulldown transistor is defined by active areas 74 and 76. The gate 80 of the pulldown transistor is fabricated in a poly 1 layer. Similarly, the second access transistor is defined by active area region 77 and active area region 78. The second word line 68 is fabricated in a poly 1 layer. A second pulldown transistor is defined by active areas 78 and 82. The gate 84 of the second pulldown transistor is fabricated in the poly 1 layer. Thus, the current from VSS to the bit line contacts flows through uninterrupted active area with none flowing through internal cell contacts or gate polysilicon. This dual bit line memory cell allowed the use of smaller Beta ratios (pulldown drive divided by access drive) due to the symmetry of the cell. However, the memory requires a larger cell for the same design rules due to the addition of another word line.

Single Bit Line Balanced SRAM Cell

Figure 6:
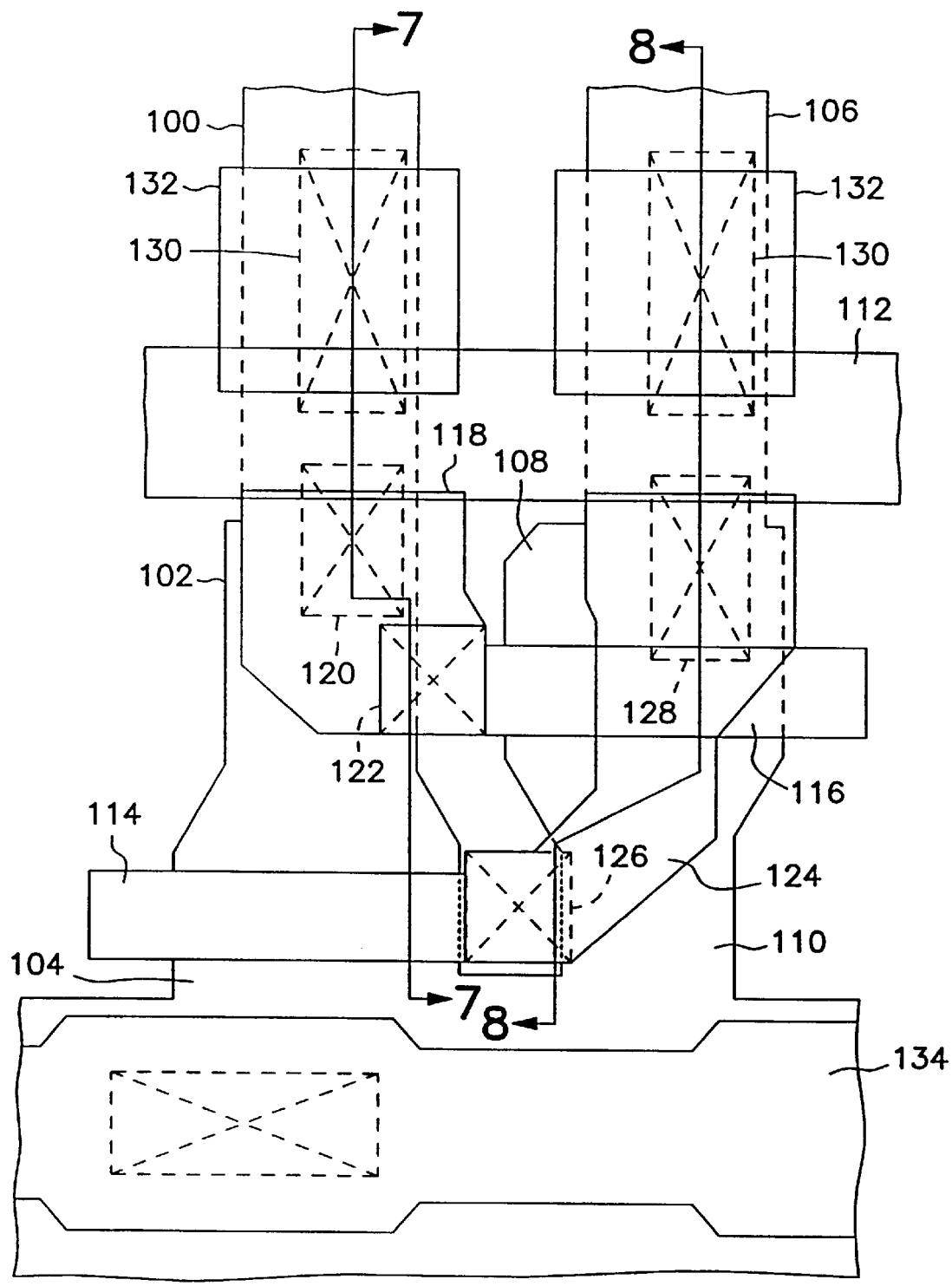
FIG. 6 is a plan view of a static memory cell of the present invention.

FIG. 6 is a plan view of a single digit line SRAM memory cell of the present invention fabricated such that current flows from VSS to bit line contacts entirely in active area. The gates of both pulldown transistors are fabricated essentially parallel to the common word line.

Referring to FIG. 6, a static memory cell is shown which has a first access transistor fabricated using active area regions 100 and 102 as drain and source regions, respectively. A polysilicon gate is fabricated as a common word line 112 which also forms a gate for a second access transistor. The second access transistor is defined by drain and source regions 106 and 108, respectively, formed using continuous active area. The source of each access transistor is integrally connected to a pulldown transistor. The source of the first access transistor is connected to the drain of a first pulldown transistor defined by active area 102 which acts as a drain region, active area 104 which operates as a source region, and a polysilicon gate 114. Likewise, the source of the second access transistor is connected to the drain of a second pulldown transistor defined by active area 108 which acts as a drain region, active area 110 which operates as a source region, and a polysilicon gate 116. The source region of each pulldown transistor is connected to a supply voltage, preferably VSS. It will be appreciated that in these described embodiments, an SRAM cell using such devices for pulldown and access devices may just as easily be constructed using p-channel devices where Vcc is substituted for Vss and the polarities of signals are reversed.

The pulldown transistor drain 102 is connected to the gate poly 116 of the second pulldown transistor through a second polysilicon layer 118 and two contacts. The second layer of polysilicon 118 is connected to the active area region 102 through a self-aligned contact 120, as known to those skilled in the art. The gate 116 is connected to second polysilicon layer 118 through a cell contact 122. The second pulldown transistor drain 108 is connected to the gate 114 of the first pulldown transistor through a slightly larger second polysilicon layer 124 and a cell contact 126. Likewise, second polysilicon layer 124 is connected to active area 108 through a self-aligned contact 128. Self-aligned contacts 130 are preferably used to connect active areas 100 and 106 to second layers of polysilicon 132 which can be connected to complementary bit lines (not shown) through their use as landing pads for subsequently formed bit line contacts. An optional polysilicon second layer 134 is provided to strap the VSS active area connected to the source regions of the pulldown transistors. It will be appreciated by those skilled in the art that active area regions 100, 102, 104, 106, 108 and 110 are formed from a single uninterrupted active area which has regions of doped silicon. These continuous active areas can be more easily seen in FIGS. 7 and 8, as explained below.

In this arrangement, the active area is aligned in strips to reduce two-dimensional encroachment corners which exist in the prior single bit line memory cell. Cross coupling of the pulldown transistor gates to the other pulldown transistor's drain is done using cell contacts and a second level of interconnect poly. This interconnect poly does not carry any appreciable current since it is only used to charge up the pulldown gates. Therefore, variability in the internal contact's resistance does not cause cell stability failure. The use of a single word line greatly reduces the area required for the cell while still enabling a very symmetrical cell (in terms of device characteristics versus misalignment). This is due to the elimination of the internal cell contacts that carry current from VSS to the bit lines.

Figure 7:
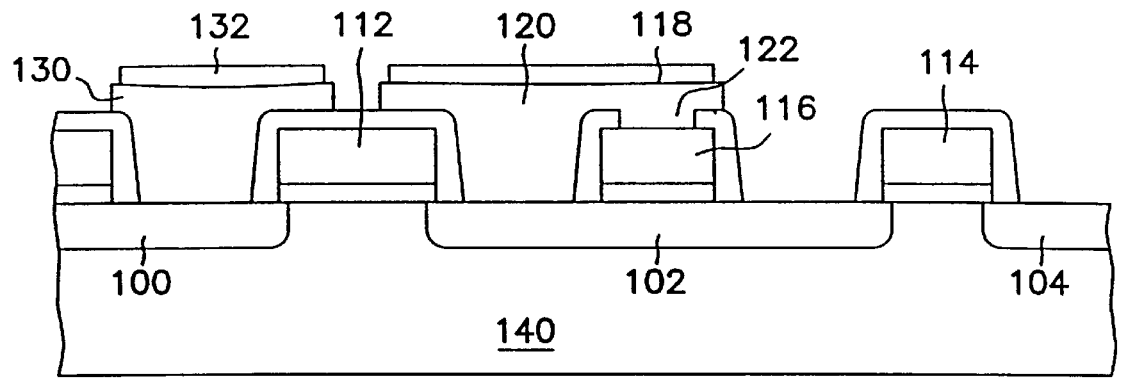
FIG. 7 is cross-section of-th static memory cell of FIG. 6.

FIG. 7 is a simplified cross section of the memory cell of FIG. 6 along line 7—7. It can be seen that a single active area 140 connects the source region 104 of the first pulldown transistor to the self-aligned contact 130 which is coupled to the bit line poly contact area 132. Region 102 is connected to the second pulldown transistor gate 116 through contact 120, poly layer 118 and cell contact 122.

Figure 8:
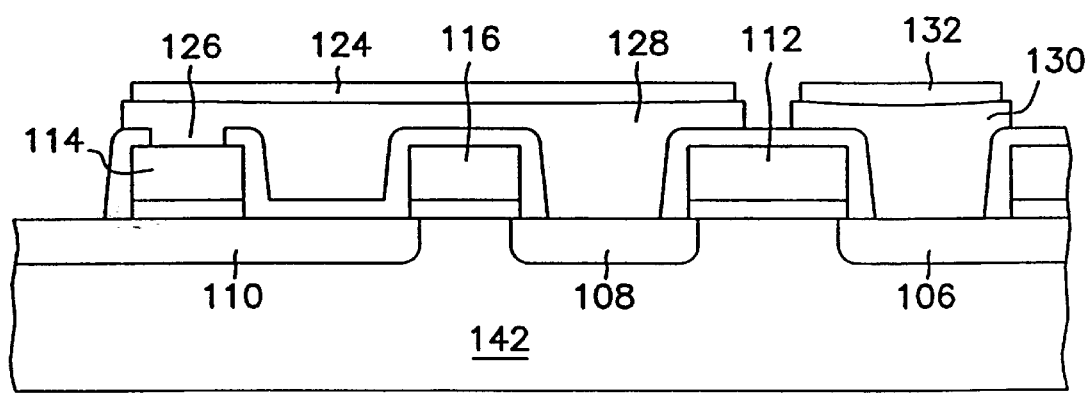
FIG. 8 is cross-section of the static memory cell of FIG. 6.

FIG. 8 is a simplified cross section of the memory cell of FIG. 6 along line 8—8. The single active area 142 connects the source region 110 of the second pulldown transistor to the self-aligned contact 130 which is coupled to the bit line poly contact area 132. Region 108 is connected to the first pulldown transistor gate 114 through contact 128, poly layer 124 and cell contact 126.

FIGS. 7 and 8 are simplified cross sections which are intended to illustrate one possible fabrication of the memory of the present invention. Other types of elements can be substituted for those described to achieve the desired result. For example, other contacts known to those skilled in the art can be used in place of self-aligned contacts 130.

The cell described minimizes area on the memory chip by forming the pulldown gates parallel to the wordlines. In this arrangement, the space between adjacent cell pulldown transistors provides the active area path from Vss to the access device sources. For a given pair of access/pulldown devices, no arrangement of poly/active area patterns could provide a smaller area requirement. In state of the art SRAM cells, the size of the cell is limited by the active area and poly patterns.

CONCLUSION

A single bit line static memory cell has been described which has two pulldown transistors coupled to access transistors. Each pulldown transistor is fabricated such that a current path between bit line contacts and a reference potential is provided through a continuous active area region. In a plan view, the memory cell has pulldown transistor gates fabricated parallel to a common word line.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, different geometries can be used for individual conductive layers. Therefore, it is manifestly intended that this invention be limited only by the claims and the equivalents thereof.

What is claimed is:

1. A static random access memory device comprising:
   an array of static memory cells, the static memory cells comprising a first access transistor connected to a first pulldown transistor thereby defining a first current path, and a second access transistor connected to a second pulldown transistor thereby defining a second current path substantially equal to the first current path;
   a single word line connected to a gate of the first and second access transistor; and
   first and second pulldown transistor gates fabricated parallel to the single word line in a plan view, wherein the first pulldown transistor and second pulldown transistor are located on a same side of the single word line.

2. The static random access memory device of claim 1 wherein the first access transistor and the first pulldown transistor are fabricated in a single active area.

3. The static random access memory device of claim 1 wherein the second access transistor and the second pulldown transistor are fabricated in a single active area.

4. The static random access memory device of claim 1 further comprising:
   a first pullup device connected to the first pulldown transistor; and
   a second pullup device connected to the second pulldown transistor.

5. An SRAM cell comprising:
   a first access transistor fabricated in a first active area having a drain connected to a first bit line, and a gate connected to a single word line;
   a first pulldown transistor fabricated in the first active area having a drain connected to a source of the first access transistor, and a source coupled to a bias voltage connection thereby defining a first electrical current path through the first active area;

a second access transistor fabricated in a second active area having a drain connected to a second bit line, and a gate connected to the single word line; and a second pulldown transistor fabricated in the second active area having a drain connected to a source of the second access transistor, and a source coupled to the bias voltage connection thereby defining a second electrical path through the second active area which is symmetrical with first electrical current path, wherein the first pulldown transistor and second pulldown transistor are located on a same side of the single word line.

6. The SRAM cell of claim 5 wherein the single word line is fabricated using a first layer of polysilicon.

7. The SRAM cell of claim 5 wherein a gate of the first pulldown transistor and a gate of the second pulldown transistor are fabricated using a first layer of polysilicon.

8. The SRAM cell of claim 7 wherein the drain of the first pulldown transistor is connected to the gate of the second pulldown transistor.

9. The SRAM cell of claim 8 wherein the drain of the first pulldown transistor is connected to the gate of the second pulldown transistor via a second layer of polysilicon.

10. The SRAM cell of claim 5 wherein the drain of the second pulldown transistor is connected to the gate of the first pulldown transistor.

11. The SRAM cell of claim 10 wherein the drain of the second pulldown transistor is connected to the gate of the first pulldown transistor via a second layer of polysilicon.

12. The SRAM cell of claim 5 further comprising:

a first pullup device connected to the first pulldown transistor; and a second pullup device connected to the second pulldown transistor.

13. An SRAM cell comprising:

a first access transistor fabricated in a first active area having a drain connected to a first bit line, and a gate connected to a single word line;

a first pulldown transistor fabricated in the first active area having a drain connected to a source of the first access transistor, and a source coupled to a bias voltage thereby defining a first electrical current path through the first active area;

a first pullup device connected to the drain of the first pulldown transistor;

a second access transistor fabricated in a second active area having a drain connected to a second bit line, and a gate connected to the single word line;

a second pulldown transistor fabricated in the second active area having a drain connected to a source of the second access transistor and a gate of the first pulldown transistor, a source coupled to the bias voltage thereby defining a second electrical path through the second active area which is substantially symmetrical with first electrical current path, and a gate connected to the drain of the first pulldown transistor; and a second pullup device connected to the drain of the second pulldown transistor, wherein the first pulldown transistor, first pullup transistor, second pulldown transistor, and second pullup transistor are all fabricated on one side of the single word line in a plan view.

14. An integrated circuit SRAM cell comprising:

a first access transistor connected to a first pulldown transistor; and a second access transistor connected to a second pulldown transistor, the first access transistor, first pulldown transistor, second access transistor, and a second pulldown transistor are fabricated in a single continuous active area, and the first and second pulldown transistors are located on one side of the single word line.

15. An integrated circuit SRAM cell comprising:

a first access transistor having source region fabricated in a first active area region, and a gate connected to a single word line;

a first pulldown transistor having a drain region fabricated in the first active area region;

a second access transistor having source region fabricated in a second active area region, and a gate connected to the single word line; and a second pulldown transistor having a drain region fabricated in the second active area region, wherein the first pulldown transistor and second pulldown transistor are fabricated on one side of the single word line in a plan view.

* * * * *